(12) United States Patent
Layadi et al.

(10) Patent No.: US 6,548,906 B2
(45) Date of Patent: Apr. 15, 2003

(54) METHOD FOR REDUCING A METAL SEAM IN AN INTERCONNECT STRUCTURE AND A DEVICE MANUFACTURED THEREBY

(75) Inventors: Nace Layadi, Singapore (SG); Alvaro Maury, Singapore (SG)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/935,241

(22) Filed: Aug. 22, 2001

(65) Prior Publication Data

US 2003/0038369 A1 Feb. 27, 2003

(51) Int. Cl.[7] ............... H01L 23/48; H01L 23/52; H01L 29/40
(52) U.S. Cl. ............... 257/763; 257/752; 257/753
(58) Field of Search ............... 257/752, 753, 257/763

(56) References Cited

U.S. PATENT DOCUMENTS 5,622,894 A    4/1997  Jang et al.
5,700,726 A    12/1997 Huang et al.
5,844,318 A  * 12/1998 Sandhu et al. ............ 257/774

OTHER PUBLICATIONS

Wolf, Silicon Processing for the VLSI Era:vol. 2—Process Integration, 1990, pp. 132, 189–192.*

* cited by examiner

Primary Examiner—David L. Talbott
Assistant Examiner—David A. Zarneke (57) ABSTRACT

The present invention provides a method of manufacturing an interconnect structure. The method may include forming a nucleation layer, including a first metal, over a barrier layer and within an opening formed in a dielectric layer, forming an intermediate layer, including a second metal such as titanium nitride, over the nucleation layer and within the opening, and forming a plug portion layer, including the first metal, over the intermediate layer and within the opening. The first metal may be tungsten and the second metal may be a titanium nitride layer.

9 Claims, 8 Drawing Sheets

METHOD FOR REDUCING A METAL SEAM IN AN INTERCONNECT STRUCTURE AND A DEVICE MANUFACTURED THEREBY

TECHNICAL FIELD OF THE INVENTION

The present invention is directed, in general, to forming an interconnect structure and, more specifically, to a method for reducing a metal seam in an interconnect structure and a device manufactured by that method.

BACKGROUND OF THE INVENTION

Devices in the semiconductor industry continue to advance toward higher performance, while maintaining or even lowering the cost of manufacturing. Micro-miniaturization of semiconductor devices has resulted in higher performance, through increases in transistor speed and in the number of devices incorporated in a chip; however, this trend has also increased yield and reliability failures. As contact or via openings decrease in size, the aspect ratio, or the ratio of the depth of the opening to the diameter of the opening, also increases. With a higher aspect ratio, the use of aluminum-based metallization to fill the contact opening, results in electromigration and reliability failures. To alleviate reliability failures, the semiconductor industry has evolved to the use of tungsten, in certain device, for filling narrow, deep contact or via openings.

The switch to tungsten filled contact openings takes advantage of the improved conformal, or step, coverage that results from the use of a plasma enhanced chemical vapor deposition (PECVD) process. In addition, tungsten's high current carrying characteristics reduce the risk of electromigration failure. The conventional method of forming tungsten plugs in vias includes plasma etching of vias or contacts, photoresist striping and cleaning, adhesion layer and barrier metal deposition by physical vapor deposition (PVD) and tungsten deposition by PECVD. Typical adhesion and barrier materials used may consist of a stack of titanium and titanium nitride, respectively. The titanium reduces the contact resistance of the interconnect, and the titanium nitride is a protective layer against titanium attack by a tungsten hexaflouride gas that is used during tungsten deposition. In addition, tungsten adheres to titanium nitride very well, resulting in a mechanically stable tungsten plug. After tungsten plug filling, voids, or so-called tungsten seams, are often observed in the tungsten material. This is particularly the case, when the etched via profiles are straight. Such tungsten seams are commonly exposed during subsequent processing, such as during processes designed to remove unwanted tungsten from regions other then the contact opening. Moreover, in certain situations the size of the tungsten seam is increased due to exposure to the removal process. This often creates a difficult topology for subsequent metallization coverage as well as electrical device degradation, which is especially apparent as leakage in metal-oxide-metal MOM capacitor structures. Therefore, processes have been developed, either attempting to create seamless tungsten contact opening fills or repairing the seam or void in the tungsten fill. For example, one attempt involves altering the via etch profile so as to assume a tapered profile, thereby reducing the tungsten seam and allowing better tungsten fill. The tapered via profile helps reduce many of the tungsten seam issues, however, it often leads to increased contact resistance, which is also very undesirable.

Accordingly, what is needed in the art is an interconnect structure and method of manufacture therefor that does not experience the tungsten "seam" problems, as experienced in the prior art.

SUMMARY OF THE INVENTION

To address the above-discussed deficiencies of the prior art, the present invention provides a method of manufacturing an interconnect structure. In an advantageous embodiment, the method includes forming a nucleation layer, including a first metal, over a barrier layer and within an opening formed in a dielectric layer. The method further includes forming an intermediate layer, including a second metal such as titanium nitride, over the nucleation layer and within the opening, and forming a plug portion layer, including the first metal, over the intermediate layer and within the opening. In one advantageous embodiment, the nucleation layer is tungsten and the intermediate layer is titanium nitride.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURES. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

Prior Art

DETAILED DESCRIPTION

Figure 1:
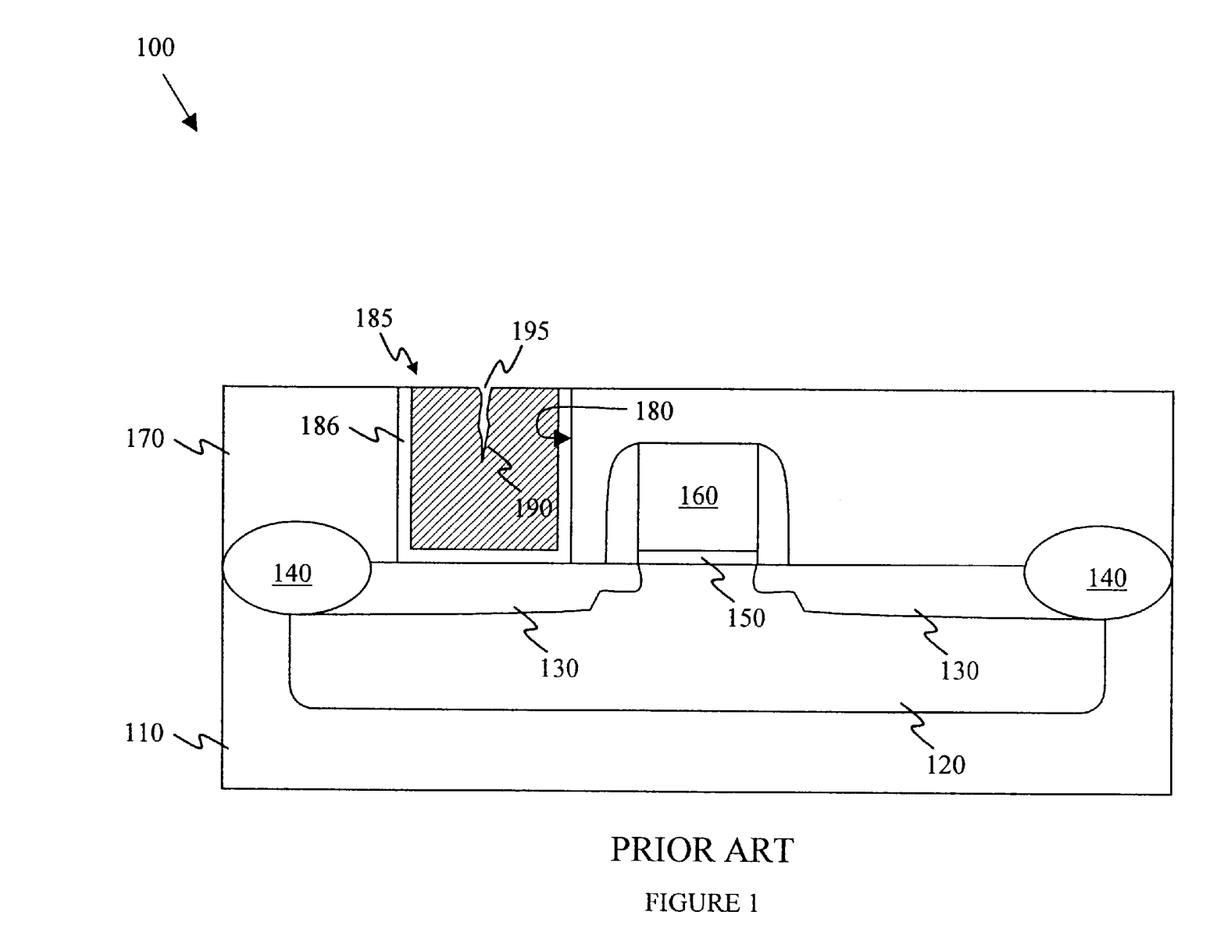
FIG. 1 illustrates a partial sectional view of a conventional interconnect structure, including an undesirable tungsten seam within a tungsten plug.

Referring initially to Prior Art FIG. 1, illustrated is a partial sectional view of a conventional integrated circuit 100 at an intermediate stage of manufacture. The conventional integrated circuit 100 includes a substrate 110, an n-channel metal oxide semiconductor (NMOS) or a p-channel metal oxide semiconductor (PMOS) tub 120, source and drain regions 130, field oxide regions 140, a gate oxide 150, a gate electrode 160, and a dielectric layer 170.

Also illustrated in Prior Art FIG. 1 is a conventional tungsten plug 185 located within a contact opening 180 within the dielectric layer 170. The tungsten plug 185 was formed using traditional formation processes, and as illustrated, includes a conventional titanium/titanium nitride barrier layer 186 located thereunder. Oftentimes, to inhibit an attack of the titanium within the titanium/titanium nitride barrier layer 186 by the tungsten hexafluoride used to form the tungsten plug 185, silane is mixed with tungsten hexafluoride. Unfortunately, however, the silane causes grains within the tungsten plug 185 to become undesirably large. The undesirably large grains tend to inadequately fill the high aspect ratio contact opening 180, which results in an unwanted tungsten seam 190.

Additionally, subsequent processing steps may ultimately expose the tungsten seam 190, creating a tungsten seam opening 195. The tungsten seam opening 195 is particularly disadvantageous, because trapped particles, such as trapped residual slurry particles resulting from a chemical mechanical polishing (CMP) process, may provide yield and contact resistance issues. In the case when a metal oxide metal (MOM) capacitor is deposited on top of the tungsten plug 185, the undesirable tungsten seam opening 195 may induce capacitor leakage and MOM reliability failure.

Figure 2:
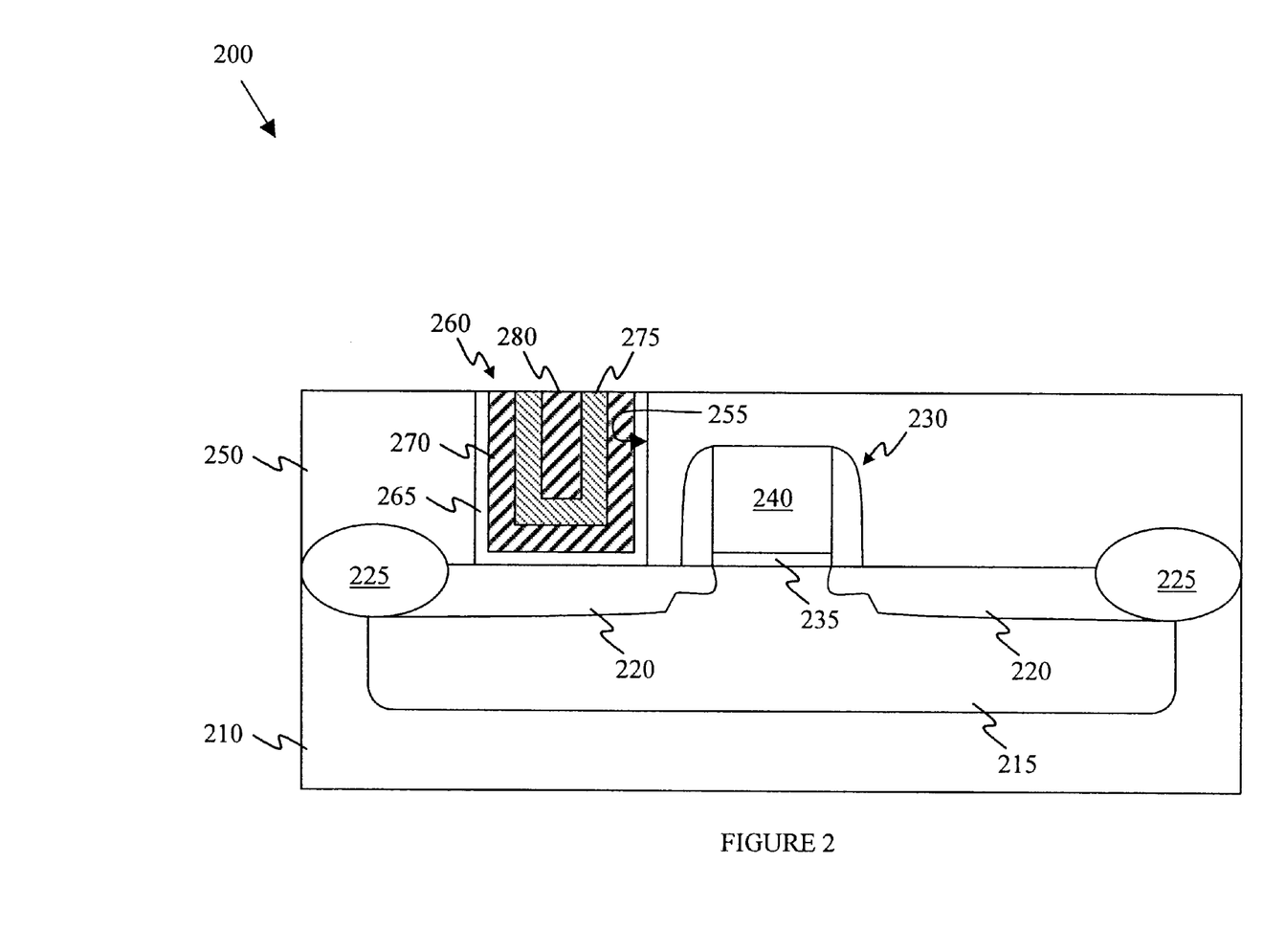
FIG. 2 illustrates one embodiment of a partially completed integrated circuit, including an interconnect structure in accordance with the present invention.

Turning now to FIG. 2, illustrated is one embodiment of a partially completed integrated circuit 200, including an interconnect structure 260 in accordance with the present invention. As illustrated in FIG. 2, the partially completed integrated circuit 200 includes a wafer substrate 210 having a tub region 215 located therein. The tub region 215 may comprise a tub for a convention n-channel metal oxide semiconductor (NMOS) device, or in an alternative embodiment, a tub for a conventional p-channel metal oxide semiconductor (PMOS) device. Further located within the wafer substrate 210 are conventional source/drain regions 220 and field oxide regions 225. Located over the wafer substrate 210, in the embodiment illustrated in FIG. 2, is a gate structure 230, including a gate oxide 235 and a gate electrode 240.

Located within a dielectric layer 250 formed over the gate structure 230, is the previously mentioned interconnect structure 260. As illustrated, the interconnect structure 260 includes a barrier layer 265 formed within a contact opening 255 in the dielectric layer 250. In one advantageous embodiment, the contact opening 255 may be a via formed in a dielectric layer between two metal layers.

The interconnect structure 260 further includes a nucleation layer 270, comprising a first metal such as tungsten, located over the barrier layer 265. Located over the nucleation layer 270 is an intermediate layer 275, which comprises a second metal, for example titanium nitride. As is illustrated, the intermediate layer 275 is also located within the contact opening 255. The interconnect structure 260 further includes a plug portion layer 280, comprising the first metal, and located over the intermediate layer 275.

The interconnect structure 260 benefits from breaking the formation thereof into at least two phases. Because thinner layers are being formed, mainly the nucleation layer 270 and the plug portion layer 280, a reduced grain growth may be achieved. Additionally, by restricting the grain growth of the layers in this way, a fine grain material with a reduced "seam," may be advantageously manufactured.

Figure 3:
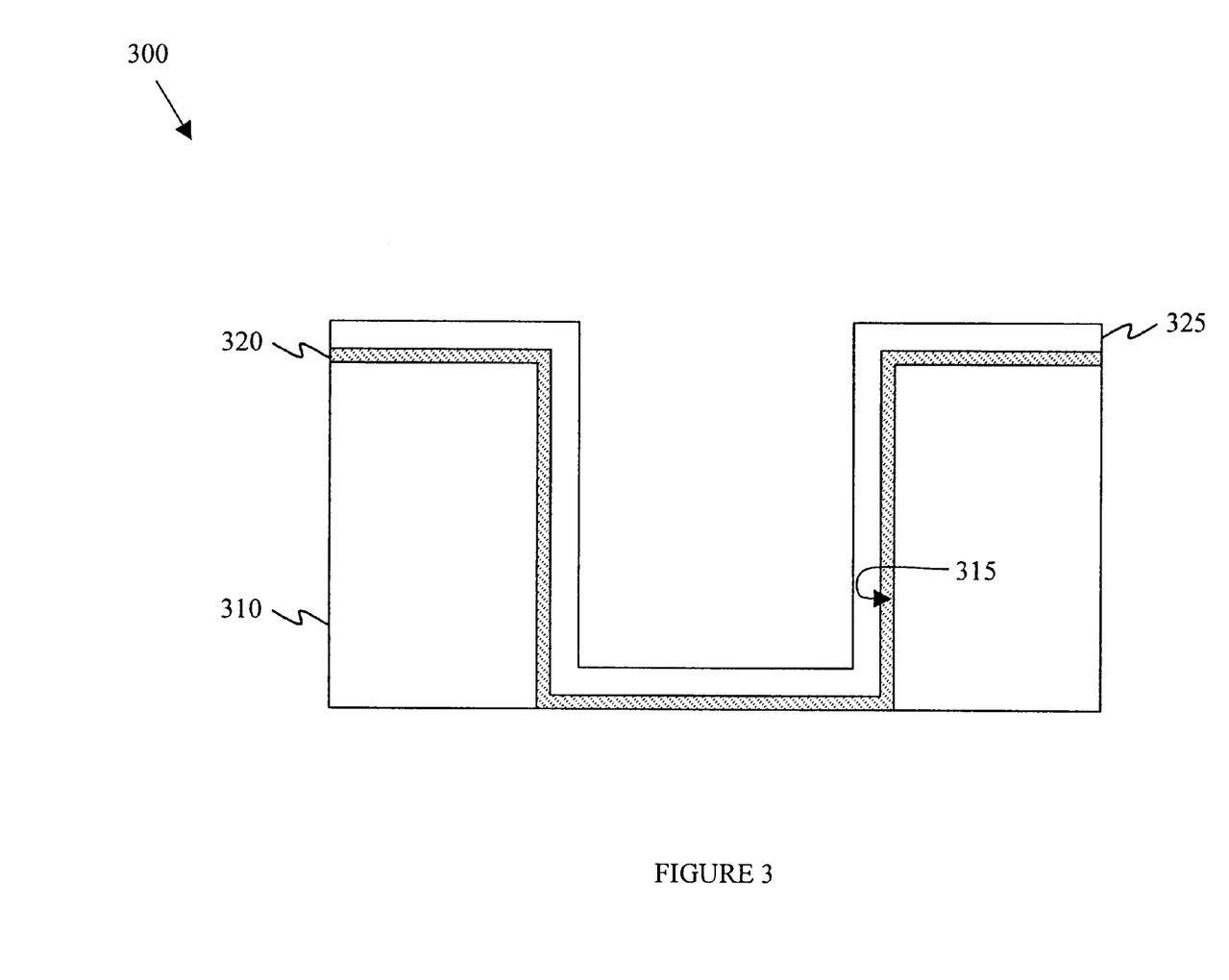
FIG. 3 illustrates a cross-sectional view of a partially completed interconnect structure according to the present invention.

Turning to FIGS. 3–7, with continued reference to FIG. 2, illustrated are detailed manufacturing steps illustrating how one might manufacture the interconnect structure 260 depicted in FIG. 2. FIG. 3 illustrates a cross-sectional view of a partially completed interconnect structure 300 according to the present invention. The partially completed interconnect structure 300 illustrated in FIG. 3 includes a dielectric layer 310, such as an interlevel dielectric layer located over a gate structure, having a contact opening 315 formed therein. One skilled in the art understands how to form such a contact opening 315, including using conventional photolithographic and etching techniques.

Optionally formed within the contact opening 315 is an adhesion layer 320. The adhesion layer 320 is advantageously designed to provide any necessary adhesion between the dielectric layer 310 and any subsequently formed layer. The adhesion layer 320 may be formed using varying manufacturing techniques and parameters, however, in one particularly advantageous embodiment, the adhesion layer 320 is formed using a conventional chemical vapor deposition (CVD) process. Likewise, the adhesion layer 320 may comprise various materials and thicknesses. For example, in one particular embodiment the adhesion layer 320 comprises titanium (Ti) or tantalum (Ta), and has a thickness ranging from about 5 nm to about 20 nm. While the adhesion layer 320 is shown in FIG. 3, one skilled in the art understands that it is only optional, and should not limit the present invention in any way.

Advantageously located over the optional adhesion layer 320 is a barrier layer 325. The barrier layer 325 in the illustrative embodiment shown in FIG. 3 comprises titanium nitride and has a thickness ranging from about 5 nm to about 50 nm. It should be noted, however, that the barrier layer 325 may comprise other materials, including tantalum nitride, tungsten nitride or another suitable material. Similar to the adhesion layer 320, the barrier layer 325 may be formed using conventional deposition processes well known to those who are skilled in the art, such as CVD or physical vapor deposition (PVD) processes.

Figure 4:
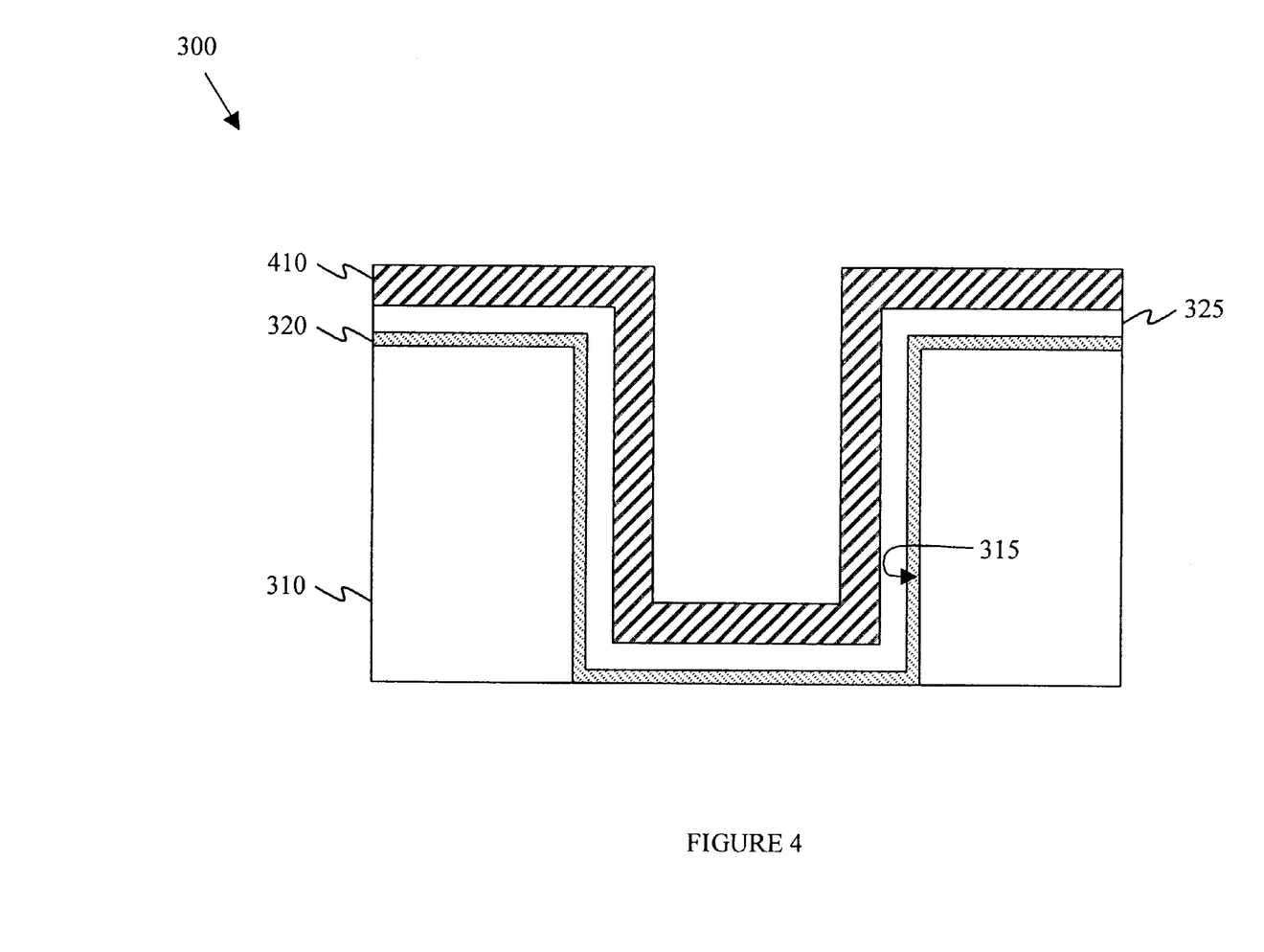
FIG. 4 illustrates the partially completed interconnect structure illustrated in FIG. 3, after formation of a nucleation layer comprising a first metal.

Turning now to FIG. 4, illustrated is the partially completed interconnect structure 300 illustrated in FIG. 3, after formation of a nucleation layer 410 comprising a first metal. As illustrated, the nucleation layer 410 is formed over the barrier layer 325 and may have a thickness ranging from about 20 nm to about 200 nm, depending on a width of the contact opening 315. In one particular advantageous embodiment, the nucleation layer 410 should be about half a total amount of the first metal thickness in the completed interconnect structure 260 (FIG. 2).

In the illustrative embodiment shown in FIG. 4, the first metal is tungsten, however, one skilled in the art understands that other similar materials that are currently known or hereafter discovered, may comprise the first metal, an therefore the nucleation layer 410. In the particular embodiment where the first metal comprises tungsten, the nucleation layer 410 may be formed with a gas mixture of tungsten hexafluoride and silane. A plasma enhanced chemical vapor deposition (PECVD) process, using temperatures ranging from about 400° C. to about 500° C., may be used to deposit the nucleation layer 410, in which case the tungsten hexafluoride is used as a source. The process of tungsten deposition starts by the formation of small nuclei or "islands" on the barrier layer 325. In an ideal case, the surface of the barrier layer 325 will eventually be covered by the same size of small and uniform individual nuclei. As the nucleation continues, the individual nuclei touch each other, and coalesce as they continue to grow, finally beginning to form a continuous film. At this point, the deposition is discontinued, providing the illustrated nucleation layer 410.

Figure 5:
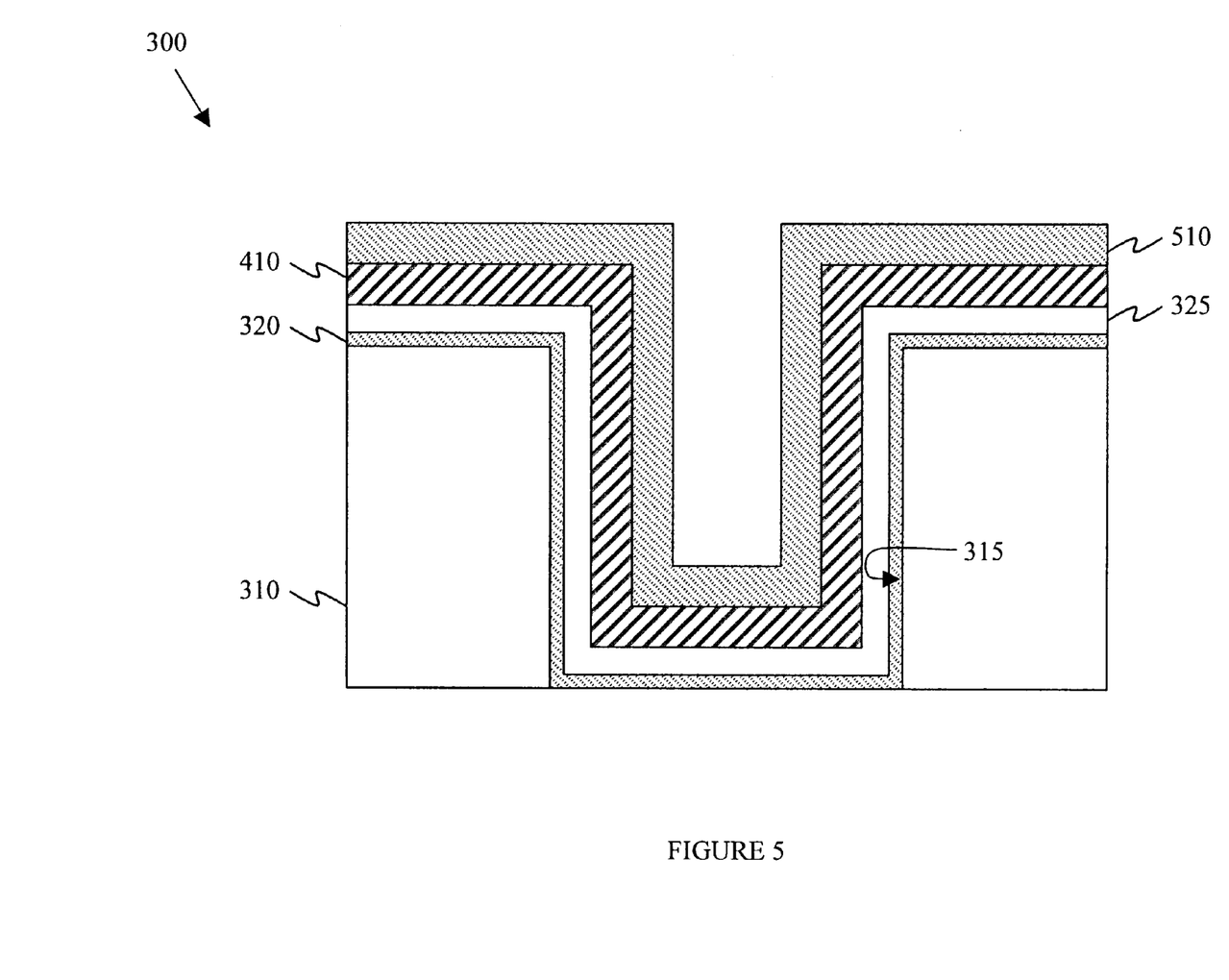
FIG. 5 illustrates the partially completed interconnect structure illustrated in FIG. 4, after formation of an intermediate layer over the nucleation layer.

Turning now to FIG. 5, illustrated is the partially completed interconnect structure 300 illustrated in FIG. 4, after formation of an intermediate layer 510 over the nucleation layer 410. The intermediate layer 510, which comprises a second metal, is desirably formed to a thickness of less than about 20 nm, and even more desirably, formed to a thickness ranging from about 5 nm to about 20 nm. Although advantageous embodiments of the present invention provide for an intermediate layer 510 with a thickness of less than about 20 nm, the thickness of the intermediate layer 510 may depend on the size of the contact opening 315 and is, thus, not necessarily limited to this range.

One embodiment of the present invention includes the second metal comprising a nitride, such as titanium nitride. While titanium nitride may be a preferred embodiment, other similar second metals, such as tantalum nitride and tungsten nitride, are also within the scope of the present invention. The intermediate layer 510 may be formed using similar manufacturing techniques as for the nucleation layer 410, such as a conventional CVD process or other similar process. The deposition of the intermediate layer 510 provides a relatively smooth surface on which a subsequent layer may be formed. The smooth surface inhibits the formation of the larger grain sizes, and thus, allows the plug to form without the seam often generated by prior art processes.

Figure 6:
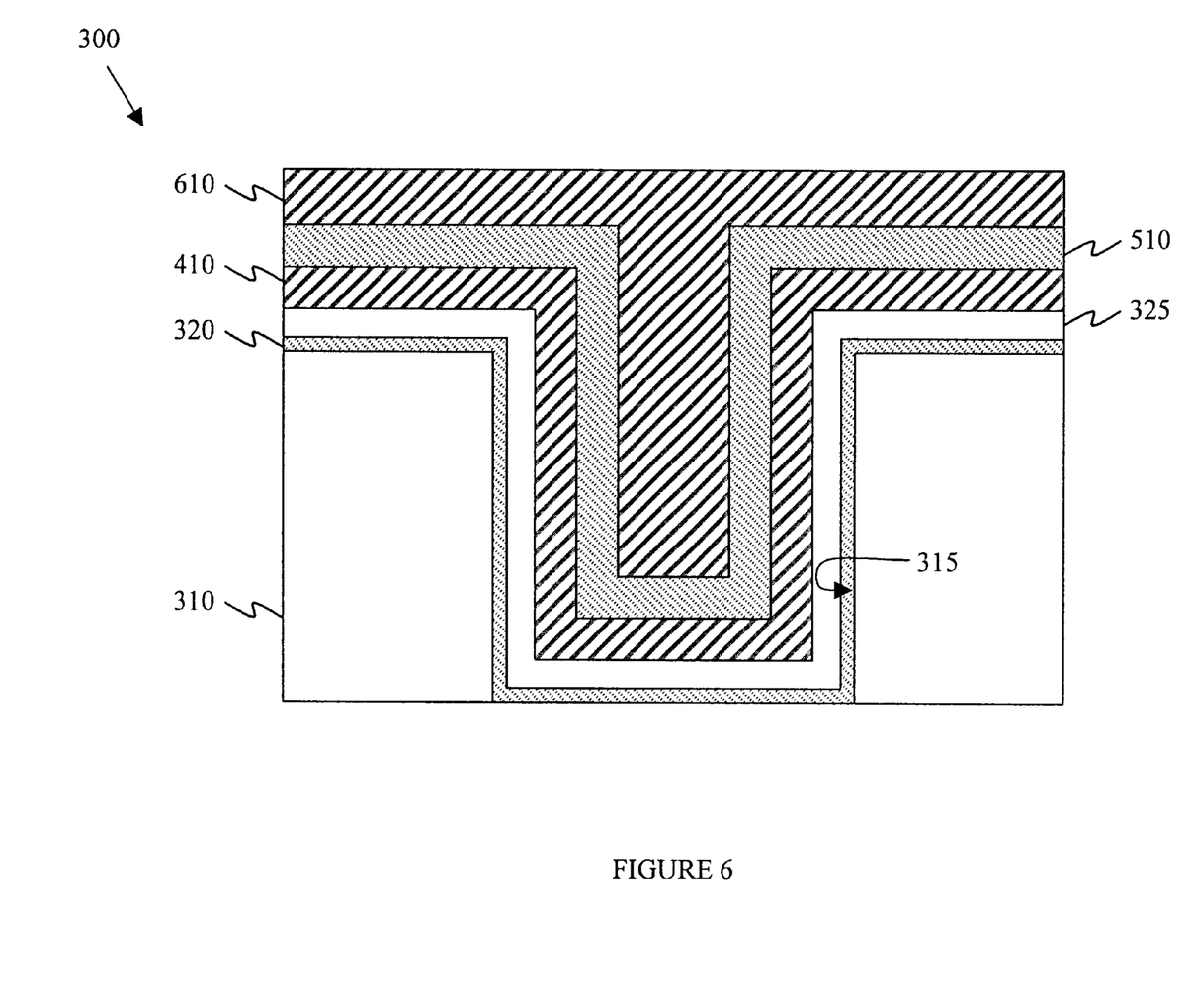
FIG. 6 illustrates the partially completed interconnect structure illustrated in FIG. 5, after formation of a plug portion layer over the intermediate layer.

Turning to FIG. 6, illustrated is the partially completed interconnect structure 300 illustrated in FIG. 5, after formation of a plug portion layer 610 over the intermediate layer 510. The plug portion layer 610 comprises a similar material as the nucleation layer 410. Thus, in various embodiments, the plug portion layer 610 may comprise tungsten or another similar material.

In the embodiment illustrated above, where the nucleation layer 410 has a thickness that is half the overall thickness of the first metal within the completed interconnect structure 260 (FIG. 2), the plug portion layer 610 would provide the other half of the overall thickness of the first metal within the completed interconnect structure 260. Thus, in the embodiment illustrated above, if the overall thickness of the first metal within the completed interconnect structure 260 is 40 nm, the nucleation layer would have a thickness of about 20 nm and the plug portion layer would have a thickness of about 20 nm. The ratio should hold the same, if the width of the contact opening 315 were increased, and the same number of layers (e.g., nucleation layer 410 and plug portion layer 610) comprise the first metal. In a particularly advantageous embodiment, the nucleation layer 410 and the plug portion layer 610 are formed such that an average grain size of the nucleation layer 410 is substantially the same size as an average grain size of the plug portion layer 610.

The plug portion layer 610 may be formed using similar manufacturing techniques as intermediate layer 510, nucleation layer 410, adhesion layer 320 and barrier layer 325. In one embodiment, the partially completed interconnect structure 300 is maintained in a single multi-chamber tool, only varying the gas composition in the various chambers to form the adhesion layer 320, barrier layer 325, nucleation layer 410, intermediate layer 510 and plug portion layer 610, respectively. Subsequent to forming the plug portion layer 610, a conventional chemical mechanical planarization (CMP) process, or another similar process, may be used to planarize the partially completed interconnect structure 300 illustrated in FIG. 6, resulting with the completed interconnect structure 260 illustrated in FIG. 2.

While the present invention has been disclosed above as only having one nucleation layer 410 and one intermediate layer 510, the present invention is not restricted to having only one of each layers. In some cases, it may be advantageous to use more than one nucleation layer 410 and intermediate layer 510, to further reduce the tungsten grain size.

Figure 7:
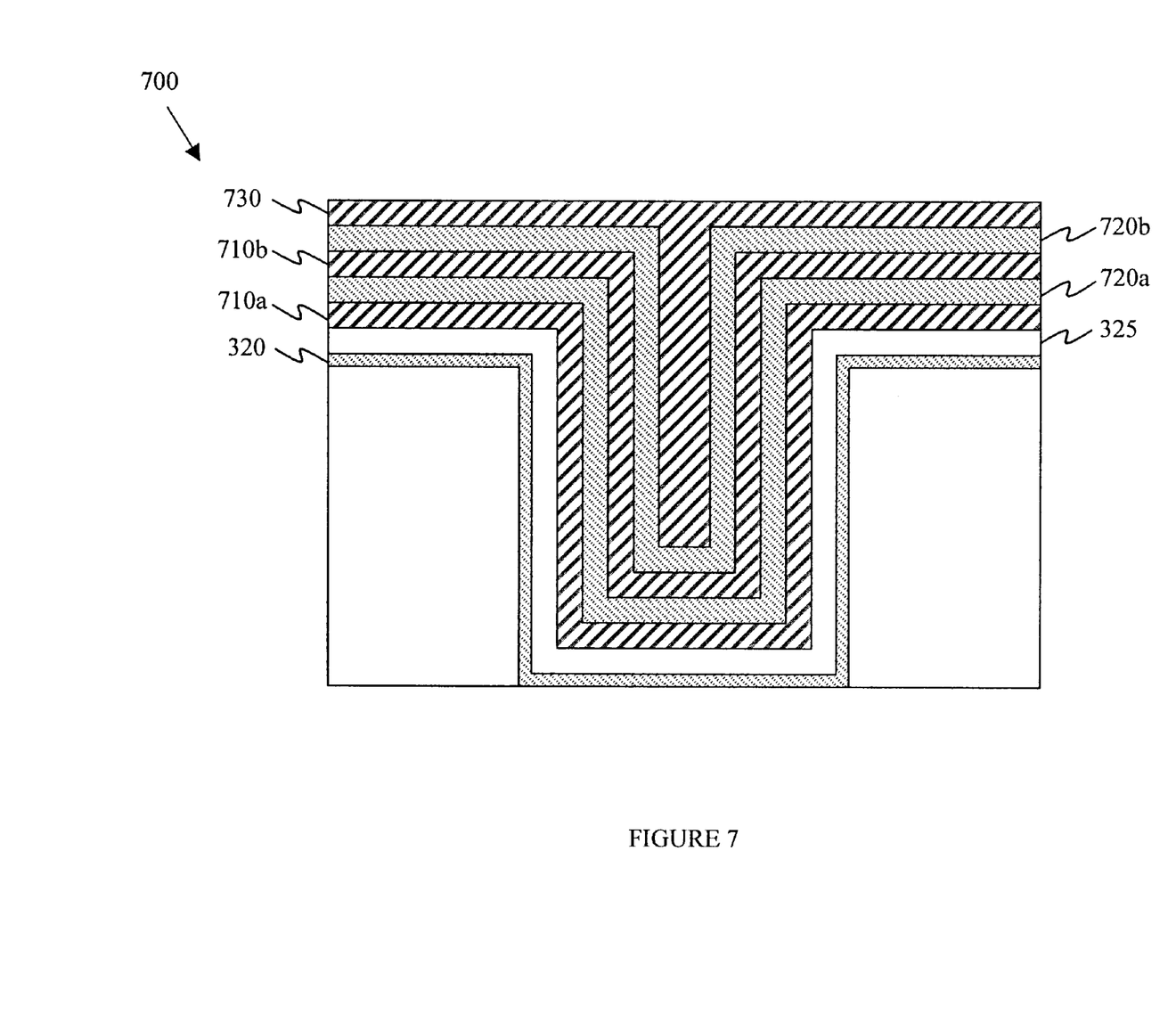
FIG. 7 illustrates an example of a partially completed interconnect structure, containing a plurality of nucleation layers and a plurality of intermediate layers.

Turning to FIG. 7, illustrated is an example of a partially completed interconnect structure 700, containing a plurality of nucleation layers 710a, 710b and a plurality of intermediate layers 720a, 720b. The thicknesses of the nucleation layer 710a, 710b and intermediate layers 720a, 720b, would vary according to the number of layers. For example, if the overall thickness of the first metal within the completed interconnect structure 260 (FIG. 2) were 45 nm, and only two nucleation layers (e.g., first nucleation layer 710a and second nucleation layer 710b) were used, the first nucleation layer 710a would desirably have a thickness of about 15 nm, the second nucleation layer 710b would desirably have a thickness of about 15 nm and a plug portion layer 730 would desirably have a thickness of about 15 nm. While only two nucleation layer 710a, 710b and intermediate layers 720a, 720b are illustrated in FIG. 7, it should be understood that numerous nucleation layers and intermediate layers are within the scope of the present invention.

Figure 8:
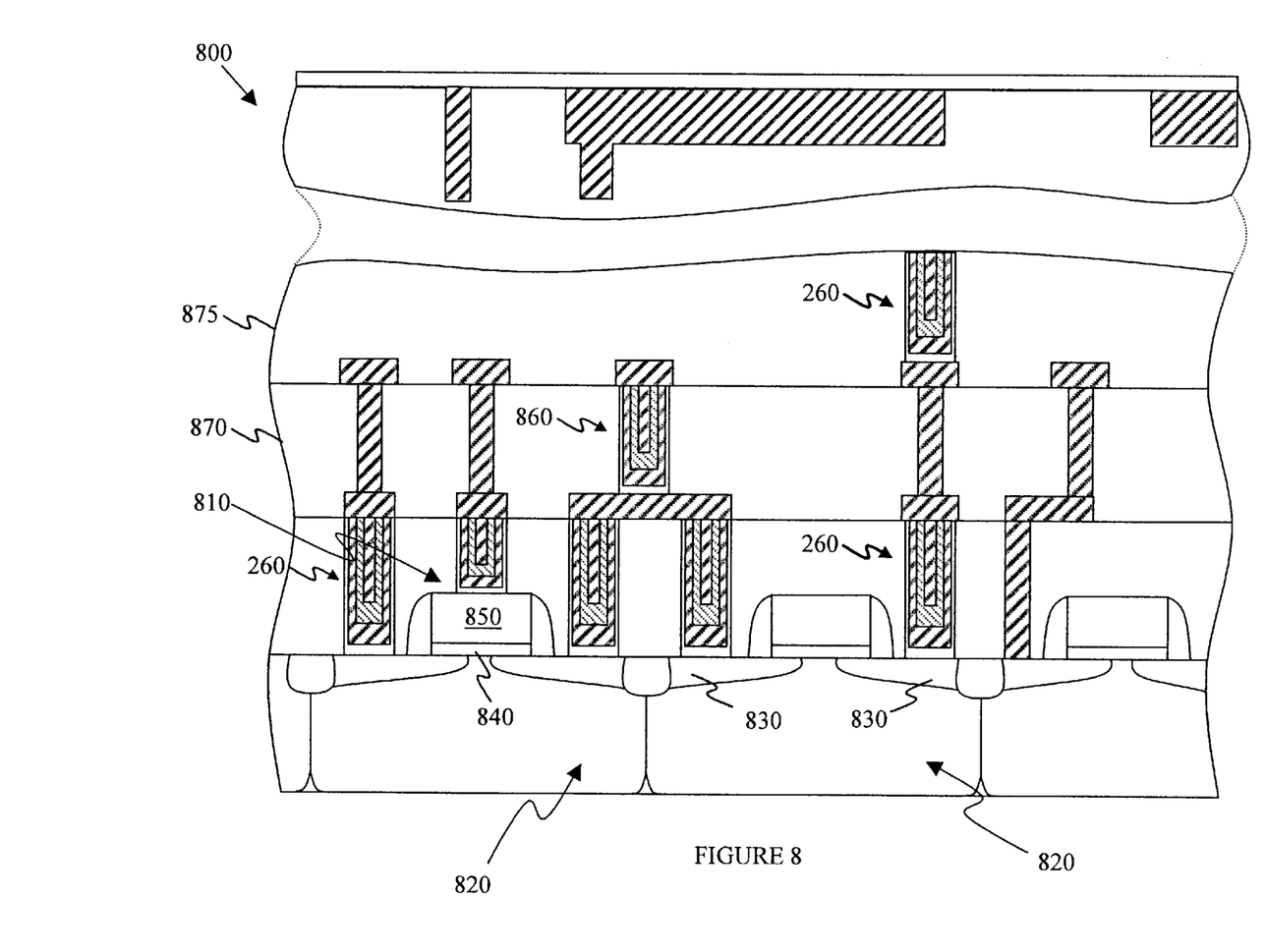
FIG. 8 illustrates a partial sectional view of an integrated circuit into which the completed interconnect structure (FIG. 2) may be incorporated.

Turning now to FIG. 8, there is illustrated a partial sectional view of an integrated circuit 800 into which the completed interconnect structure 260 (FIG. 2) may be incorporated. The integrated circuit 800 may include active devices, such as transistors, used to form CMOS devices, BiCMOS devices, Bipolar devices, or other types of active devices. The integrated circuit 800 may further include passive devices such as inductors or resistors, or it may also include optical devices or optoelectronic devices. Those skilled in the art are familiar with these various types of device and their manufacture.

In the illustrated embodiment, the integrated circuit 800 includes conventionally formed transistors 810, tubs 820, source/drains 830, gate oxides 840 and gate electrodes 850. The conventional devices 810, such as transistors, can be interconnected by the completed interconnect structures 260. It should be understood that the interconnect 260 may form a contact plug that contacts the source/drains 830, or the gate electrodes 850. It may also form a via 860 that extends through an interlevel dielectric layer 870 or 875, interconnecting various devices 810 to form an operative integrated circuit.

Although the present invention has been described in detail, those skilled in the art should understand that they can make various changes, substitutions and alterations herein without departing from the spirit and scope of the invention in its broadest form.

What is claimed is:
1. An interconnect structure, comprising:
   a nucleation layer including a first metal located over a barrier layer within an opening in a dielectric layer, wherein the nucleation layer includes substantially uniform grains;
   an intermediate layer including a second metal located over the nucleation layer; and
   a bulk plug layer including the first metal located over the intermediate layer.

2. The interconnect structure as recited in claim 1 wherein the first metal comprises tungsten.

3. The interconnect structure as recited in claim 2 wherein the plug portion layer comprises tungsten.

4. The interconnect structure as recited in claim 1 wherein the intermediate layer comprises titanium nitride.

5. The interconnect structure as recited in claim 1 further including an adhesion layer comprising titanium located under a barrier layer comprising titanium nitride.

6. The interconnect structure as recited in claim 1 wherein the intermediate layer has a thickness of less than about 20 nm.

7. The interconnect structure as recited in claim 1 wherein the nucleation layer has a thickness that ranges from about 20 nm to 200 nm.

8. The interconnect structure as recited in claim 1 wherein the nucleation layer has an average grain size that is substantially equal to an average grain size of the plug portion layer.

9. The interconnect structure as recited in claim 1 further including a plurality of alternating intermediate layers and nucleation layers.

* * * * *